(12) United States Patent
Hsieh et al.

US010700045B2

(10) Patent No.: US 10,700,045 B2
(45) Date of Patent: *Jun. 30, 2020

(54) SURFACE MOUNT DEVICE/INTEGRATED PASSIVE DEVICE ON PACKAGE OR DEVICE STRUCTURE AND METHODS OF FORMING

(71) Applicant: Taiwan Semiconductor Manufacturing Company, Ltd., Hsinchu (TW)

(72) Inventors: Cheng-Hsien Hsieh, Kaohsiung (TW); Hsien-Wei Chen, Hsinchu (TW); Chi-Hsi Wu, Hsinchu (TW); Chen-Hua Yu, Hsinchu (TW); Der-Chyang Yeh, Hsinchu (TW); Wei-Cheng Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/675,696

(22) Filed: Nov. 6, 2019

(65) Prior Publication Data

US 2020/0075563 A1   Mar. 5, 2020

Related U.S. Application Data

(63) Continuation of application No. 16/200,148, filed on Nov. 26, 2018, now Pat. No. 10,504,877, which is a (Continued)

(51) Int. Cl.
*H01L 25/10* (2006.01)
*H01L 23/00* (2006.01)
(Continued)

(52) U.S. Cl.
CPC ............ *H01L 25/105* (2013.01); *H01L 24/19* (2013.01); *H01L 25/50* (2013.01); *H01L 21/568* (2013.01);
(Continued)

(58) Field of Classification Search
CPC combination set(s) only.
See application file for complete search history.

(56) References Cited

U.S. PATENT DOCUMENTS 6,093,631 A    7/2000  Jaso et al.
6,118,180 A *  9/2000  Loo .......................... H01L 24/02
                                                  228/180.22

(Continued)

FOREIGN PATENT DOCUMENTS

TW          201125096 A      7/2011

*Primary Examiner* — Nduka E Ojeh
(74) *Attorney, Agent, or Firm* — Slater Matsil, LLP

(57) ABSTRACT

Package structures and methods of forming them are described. In an embodiment, a package structure includes an integrated circuit die embedded in an encapsulant and a redistribution structure on the encapsulant. The redistribution structure includes a metallization layer distal from the encapsulant and the integrated circuit die, and a dielectric layer distal from the encapsulant and the integrated circuit die and on the metallization layer. The package structure also includes a first under metallization structure on the dielectric layer and a Surface Mount Device and/or Integrated Passive Device ("SMD/IPD") attached to the first under metallization structure. The first under metallization structure includes first through fourth extending portions extending through first through fourth openings of the dielectric layer to first through fourth patterns of the metallization layer, respectively. The first opening, the second opening, the third opening, and the fourth opening are physically separated from each other.

20 Claims, 19 Drawing Sheets

Related U.S. Application Data continuation of application No. 14/815,388, filed on Jul. 31, 2015, now Pat. No. 10,141,288.

(51) Int. Cl.
*H01L 25/00* (2006.01)
*H01L 21/56* (2006.01)

(52) U.S. Cl.
CPC ............... *H01L 2224/04105* (2013.01); *H01L 2224/12105* (2013.01); *H01L 2225/1041* (2013.01); *H01L 2924/18162* (2013.01)

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,671,459 B2 | 6/2017 | Hagihara et al. | |
| 10,141,288 B2 | 11/2018 | Hsieh et al. | |
| 2005/0093176 A1 | 5/2005 | Hung et al. | |
| 2006/0278984 A1 | 12/2006 | Yamada | |
| 2006/0283903 A1 | 12/2006 | Vitito | |
| 2008/0316714 A1 | 12/2008 | Eichelberger et al. | |
| 2009/0283903 A1* | 11/2009 | Park | H01L 24/03 257/737 |
| 2010/0140736 A1 | 6/2010 | Lin et al. | |
| 2011/0083115 A1 | 4/2011 | Liu et al. | |
| 2011/0215470 A1 | 9/2011 | Chen et al. | |
| 2011/0241202 A1* | 10/2011 | Liu | H01L 23/552 257/E23.021 |
| 2011/0291288 A1 | 12/2011 | Wu et al. | |
| 2012/0180018 A1 | 7/2012 | Chen et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168805 A1 | 7/2013 | Yu et al. | |
| 2013/0168848 A1 | 7/2013 | Lin et al. | |
| 2013/0249589 A1* | 9/2013 | Chen | H01L 22/14 324/762.01 |
| 2013/0256874 A1 | 10/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0252647 A1 | 9/2014 | Huang et al. | |
| 2014/0264930 A1 | 9/2014 | Yu et al. | |
| 2014/0299999 A1* | 10/2014 | Hu | H01L 21/56 257/774 |
| 2015/0001718 A1 | 1/2015 | Hatada et al. | |
| 2015/0041985 A1* | 2/2015 | Hsieh | H01L 21/76879 257/773 |
| 2016/0300813 A1* | 10/2016 | Zhai | H01L 21/561 |

* cited by examiner

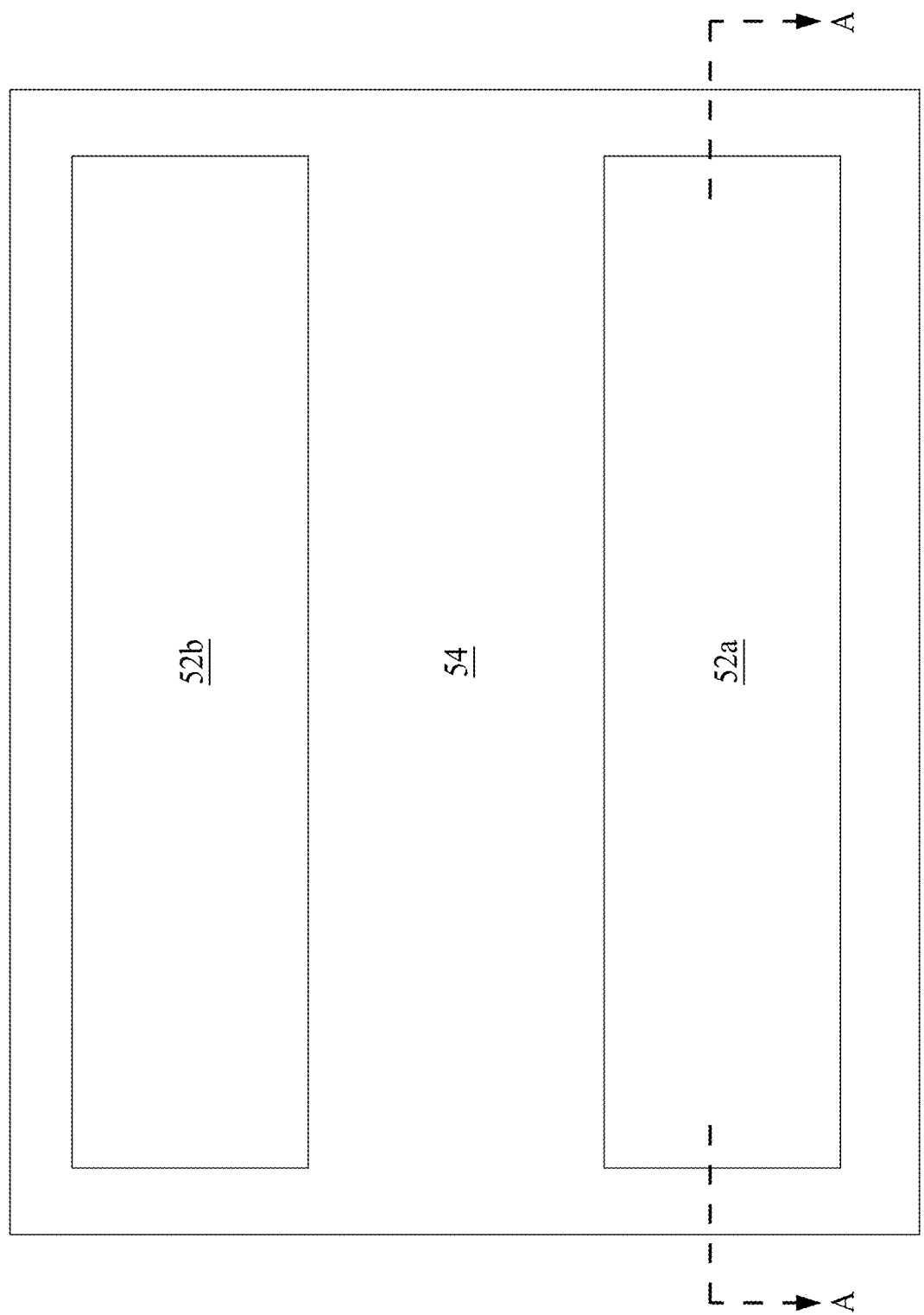

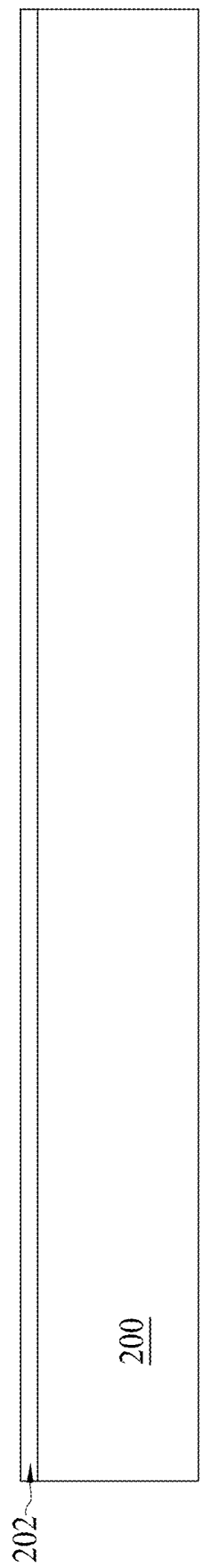

SURFACE MOUNT DEVICE/INTEGRATED PASSIVE DEVICE ON PACKAGE OR DEVICE STRUCTURE AND METHODS OF FORMING

PRIORITY CLAIM AND CROSS-REFERENCE

This application is a continuation of U.S. patent application Ser. No. 16/200,148, filed on Nov. 26, 2018, which is a continuation of U.S. patent application Ser. No. 14/815,388, filed on Jul. 31, 2015, now U.S. Pat. No. 10,141,288, issued on Nov. 27, 2018, which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2C are various views of a second structure to attach a SMD/IPD in accordance with some embodiments.

FIGS. 4 through 13 are cross sectional views of intermediate steps during a manufacturing process for forming a package in accordance with some embodiments.

DETAILED DESCRIPTION

Figure 1A:
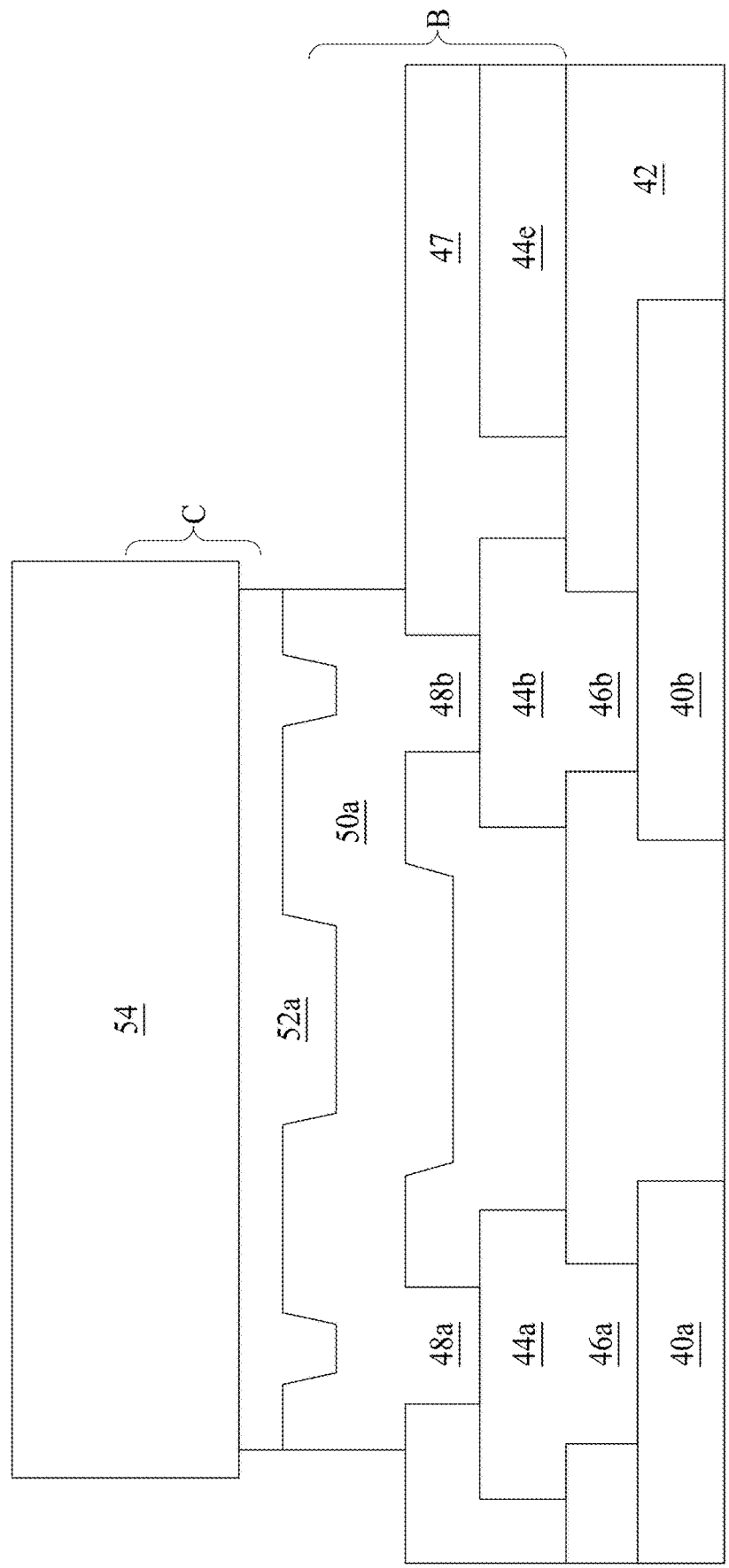
FIGS. 1A through 1C are various views of a first structure to attach a SMD and/or IPD (generally, "SMD/IPD") in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a Surface Mount Device (SMD) and/or Integrated Passive Device (IPD) attached to a fan-out or fan-in wafer-level package, and various structures used to attach a SMD and/or IPD to such a package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

Figure 1B:
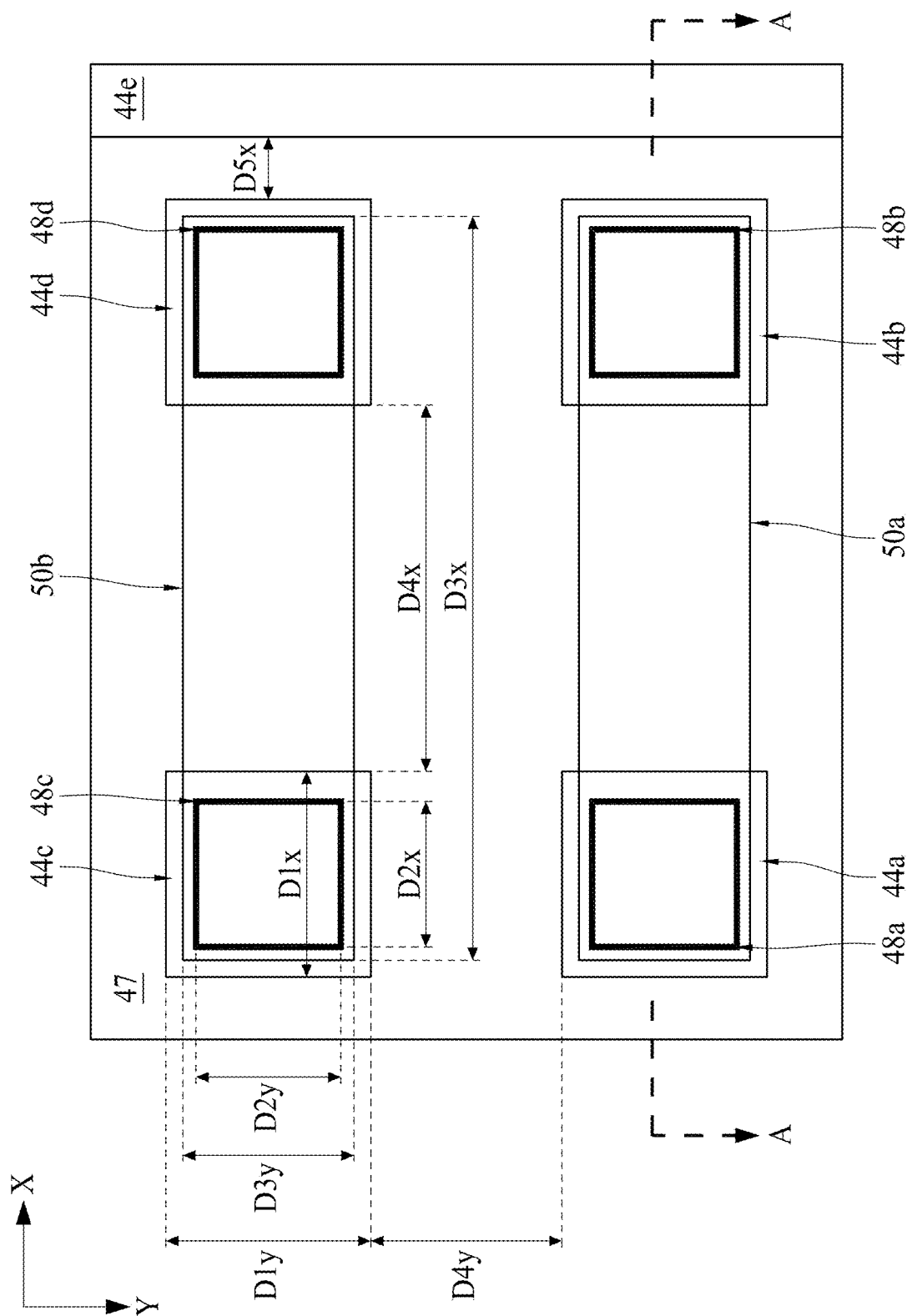
Figure 1C:
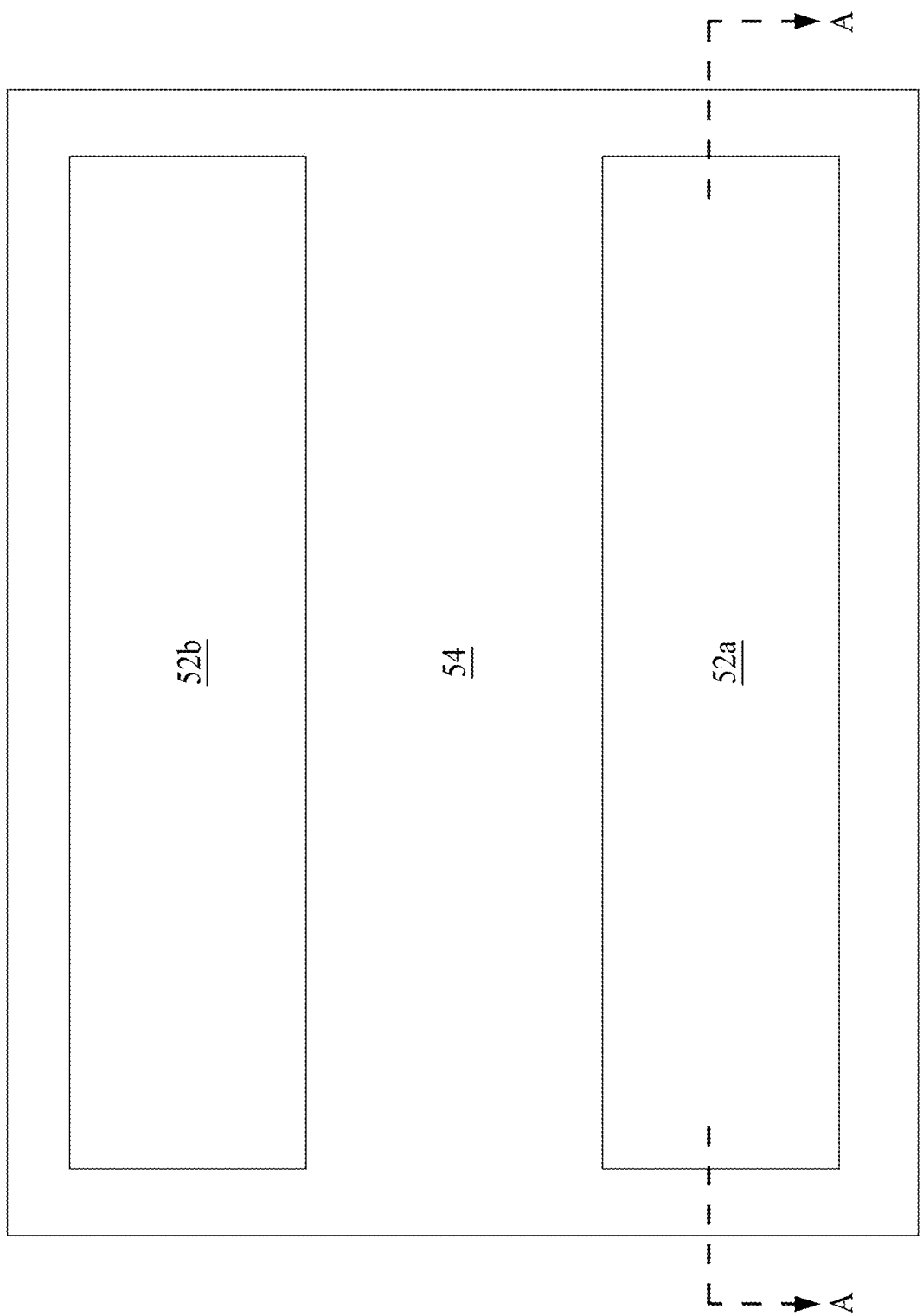

FIGS. 1A through 1C illustrate various views of a structure to attach a SMD and/or IPD (generally, "SMD/IPD") in accordance with some embodiments. FIG. 1A is a cross-sectional view of a structure on which an SMD/IPD 54 is attached, and FIGS. 1B and 1C are overlaid layout views of respective portions of the structure. FIG. 1B illustrates an overlaid layout view of section B in FIG. 1A, and FIG. 1C illustrates an overlaid layout view of section C in FIG. 1A. Cross-section A-A in FIGS. 1B and 1C is the cross-sectional view illustrated in FIG. 1A. Example materials and methods for forming this structure are discussed in the context of the manufacturing process of FIGS. 4 through 13, and hence, such materials and processes are omitted here for brevity.

FIG. 1A illustrates a lower metallization layer including a first lower metallization pattern 40a and a second lower metallization pattern 40b. Each of the first lower metallization pattern 40a and the second lower metallization pattern 40b can be a line, landing pad, or the like in the lower metallization layer. A lower dielectric layer 42 is over and on the lower metallization layer, including the first lower metallization pattern 40a and the second lower metallization pattern 40b.

An upper metallization layer is on the lower dielectric layer 42, and the upper metallization layer includes a first upper metallization pattern 44a with a first via 46a and includes a second upper metallization pattern 44b with a second via 46b. As illustrated in FIG. 1B (but not specifically in FIG. 1A), the upper metallization layer further includes a third upper metallization pattern 44c and a fourth upper metallization pattern 44d. In both FIGS. 1A and 1B, the upper metallization pattern further includes a fifth upper metallization pattern 44e. Each of the first upper metallization pattern 44a, the second upper metallization pattern 44b, the third upper metallization pattern 44c, and the fourth upper metallization pattern 44d can be a line, landing pad, or the like in the upper metallization layer. The first via 46a extends through the lower dielectric layer 42 and is electrically and directly mechanically coupled to the first lower metallization pattern 40a and the first upper metallization pattern 44a, and the second via 46b extends through the lower dielectric layer 42 and is electrically and directly mechanically coupled to the second lower metallization pattern 40b and the second upper metallization pattern 44b. A third via 46c and a fourth via 46d may extend through the lower dielectric layer and be electrically and directly mechanically coupled to the third upper metallization pattern 44c and the fourth upper metallization pattern 44d, respectively, and a respective lower metallization pattern. An upper dielectric layer 47 is over and on the upper metallization layer, including the first upper metallization pattern 44a and the second upper metallization pattern 44b.

A first under metallization 50a is on the upper dielectric layer 47. The first under metallization 50a includes a first extending portion 48a and a second extending portion 48b. The first extending portion 48a extends through the upper dielectric layer 47 and is electrically and directly mechanically coupled to the first upper metallization pattern 44a, and the second extending portion 48b extends through the upper dielectric layer 47 and is electrically and directly mechanically coupled to the second upper metallization pattern 44b. The first extending portion 48a and the second extending portion 48b extend from the first under metallization 50a through separate openings through the upper dielectric layer 47 to the first upper metallization pattern 44a and the second upper metallization pattern 44b, respectively. As illustrated in FIG. 1B (but not specifically in FIG. 1A), a second under metallization 50b is on the upper dielectric layer 47 and includes a third extending portion 48c and a fourth extending portion 48d. The third extending portion 48c extends through the upper dielectric layer 47 and is electrically and directly mechanically coupled to the third upper metallization pattern 44c, and the fourth extending portion 48d extends through the upper dielectric layer 47 and is electrically and directly mechanically coupled to the fourth upper metallization pattern 44d. The third extending portion 48c and the fourth extending portion 48d extend from the second under metallization 50b through separate openings through the upper dielectric layer 47 to the third upper metallization pattern 44c and the fourth upper metallization pattern 44d, respectively. Although not specifically illustrated in a cross-sectional view, the second under metallization 50b with the third extending portion 48c to the third upper metallization pattern 44c and with the fourth extending portion 48d to the fourth upper metallization pattern 44d may have a same or similar cross-section as corresponding components illustrated in FIG. 1A.

As shown in FIG. 1A, the first under metallization 50a (and similarly the second under metallization 50b, although not specifically illustrated) can have a depression laterally between the first extending portion 48a and the second extending portion 48b. This may result from a degree of planarity of the immediately underlying surface of the upper dielectric layer 47. This surface of the upper dielectric layer 47 may result from various physical effects during its formation. For example, a distance between the first upper metallization pattern 44a and the second upper metallization pattern 44b, without any intervening upper metallization pattern therebetween, can cause a meniscus effect in this surface of the upper dielectric layer 47 when the upper dielectric layer 47 is spun-on. In other examples, the immediately underlying surface of the upper dielectric layer 47 is planar, which can result in no depression being laterally between the first extending portion 48a and the second extending portion 48b.

A first connector 52a electrically and directly mechanically connects the first under metallization 50a and a first terminal of a SMD/IPD 54. A second connector 52b electrically and directly mechanically connects the second under metallization 50b and a second terminal of the SMD/IPD 54. The SMD/IPD 54 can be smaller than a typical integrated circuit die (such as integrated circuit die 206 discussed below) and can include one or more passive device, such as a capacitor, resistor, diode, or the like, without including an active device, such as a transistor or the like.

FIG. 1B further illustrates various dimensions of components. An X-axis and a Y-axis are depicted for ease of reference. Reference to an extending portion 48 refers to any of the extending portions 48a, 48b, 48c, and 48d individually. Reference to an upper metallization pattern 44 refers to any of the upper metallization patterns 44a, 44b, 44c, and 44d individually. Reference to an under metallization 50 refers to under metallizations 50a and 50b individually.

The upper metallization pattern 44 has a first x-direction dimension $D1x$ and a first y-direction dimension $D1y$, which may be equal. The extending portion 48 has a second x-direction dimension $D2x$ and a second y-direction dimension $D2y$, which may be equal. The under metallization 50 has a third x-direction dimension $D3x$ and a third y-direction dimension $D3y$. A fourth x-direction dimension $D4x$ is between the upper metallization patterns 44 that are connected through respective extending portions 48 to a same under metallization 50. A fourth y-direction dimension $D4y$ is between the nearest upper metallization patterns 44 that are connected through respective extending portions 48 to different under metallizations 50 that are used to attach a same SMD/IPD 54. A smallest fifth x-direction dimension $D5x$ is between an upper metallization pattern 44 and the fifth upper metallization pattern 44e.

In some embodiments, the under metallization 50 extends laterally beyond a corresponding extending portion 48 in both an x-direction and a y-direction. For example, in FIG. 1B, the under metallization 50 extends laterally in a y-direction from both y-boundaries of the corresponding extending portion 48, such as by a distance of half of the difference between dimension $D3y$ and dimension $D2y$ $$\left(\text{i.e., } \frac{D_{3y} - D_{2y}}{2}\right).$$

Further, for example, the under metallization 50 extends laterally in an x-direction from both x-boundaries of the corresponding extending portion 48, such as by a distance of half of a difference between the dimension D3x and a sum of dimensions D4x, D2x, and D1x $$\left(\text{i.e.,} \frac{D_{3x} - (D_{4x} + D_{2x} + D_{1x})}{2}\right)$$

from one x-boundary, and by a distance toward another extending portion 48 of the same under metallization 50.

In some embodiments, the upper metallization pattern 44 extends laterally beyond a corresponding extending portion 48 in both an x-direction and a y-direction. For example, in FIG. 1B, the upper metallization pattern 44 extends laterally in a y-direction from both y-boundaries of the corresponding extending portion 48, such as by a distance of half of the difference between dimension D1y and dimension D2y $$\left(\text{i.e.,} \frac{D_{1y} - D_{2y}}{2}\right).$$

Further, for example, the upper metallization pattern 44 extends laterally in an x-direction from both x-boundaries of the corresponding extending portion 48, such as by a distance of half of a difference between the dimension D1x and the dimension D2x $$\left(\text{i.e.,} \frac{D_{1x} - D_{2x}}{2}\right).$$

In some embodiments, the upper metallization pattern 44 extends laterally beyond a corresponding under metallization 50 in both an x-direction and a y-direction. For example, in FIG. 1B, the upper metallization pattern 44 extends laterally in a y-direction from both y-boundaries of the corresponding under metallization 50, such as by a distance of half of the difference between dimension D1y and dimension D3y $$\left(\text{i.e.,} \frac{D_{1y} - D_{3y}}{2}\right).$$

Further, for example, the upper metallization pattern 44 extends laterally in an x-direction from an x-boundary of the corresponding under metallization 50, such as by a distance of half of the sum of twice the dimension D1x and dimension D4x less the dimension D3x $$\left(\text{i.e.,} \frac{(2D_{1x} + D_{4x}) - D_{3x}}{2}\right),$$

and the under metallization 50 extends laterally in an x-direction from another x-boundary of the upper metallization pattern 44 to another upper metallization pattern 44 to which the under metallization 50 is connected through an extending portion 48.

In some embodiments, dimension D1x is greater than dimension D2x (i.e., $D_{1x} > D_{2x}$). Further in some embodiments, dimension D1y is greater than dimension D3y, which is greater than dimension D2y (i.e., $D_{1y} > D_{3y} > D_{2y}$). In some embodiments, the dimensions D1x and D1y can be in a range from about 160 µm to about 300 µm, such as about 255 µm. In some embodiments, the dimensions D2x and D2y can be in a range from about 100 µm to about 240 µm, such as about 195 µm. In some embodiments, the dimension D3x can be in a range from about 620 µm to about 1500 µm, such as about 1000 µm, and the dimension D3y can be in a range from about 130 µm to about 270 µm, such as about 200 µm. In some embodiments, the dimension D4x can be in a range from about 110 µm to about 1210 µm, such as about 520 µm, and the dimension D4y can be in a range from about 110 µm to about 340 µm, such as about 170 µm. In some embodiments, the dimension D5x can be greater than about 40 µm.

In the illustrated embodiment, the upper metallization pattern 44 and the extending portion 48 are each square ($D_{1x} = D_{1y}$, and $D_{2x} = D_{2y}$), and the under metallization 50 is rectangular (e.g., $D_{3x} > D_{3y}$). In other embodiments, these components can take on different shapes, such as circular, ovaloid, hexagonal, octagonal, or any other polygonal shape. Further, the dimensions may have different relationships.

Figure 2A:
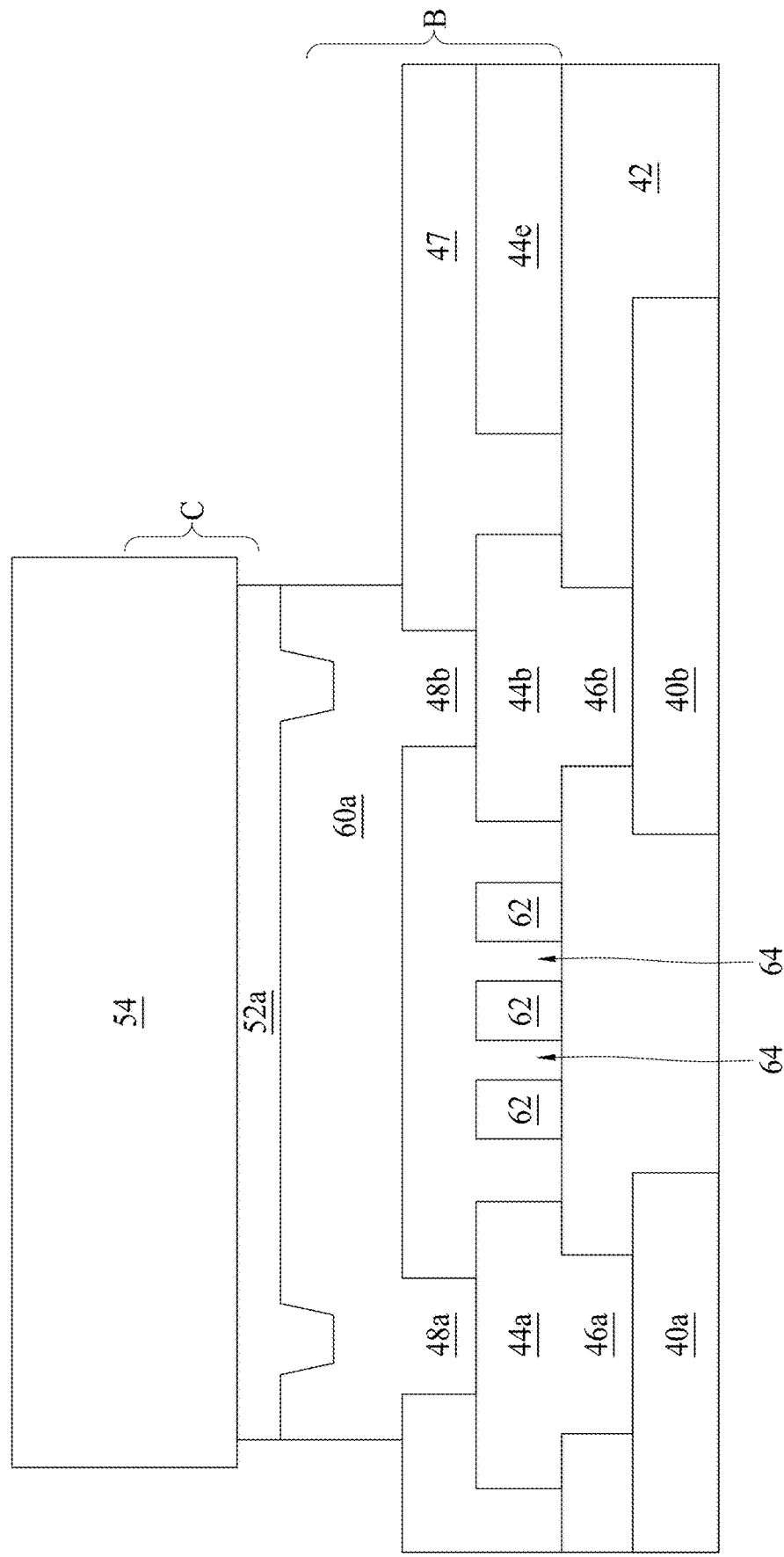
Figure 2B:
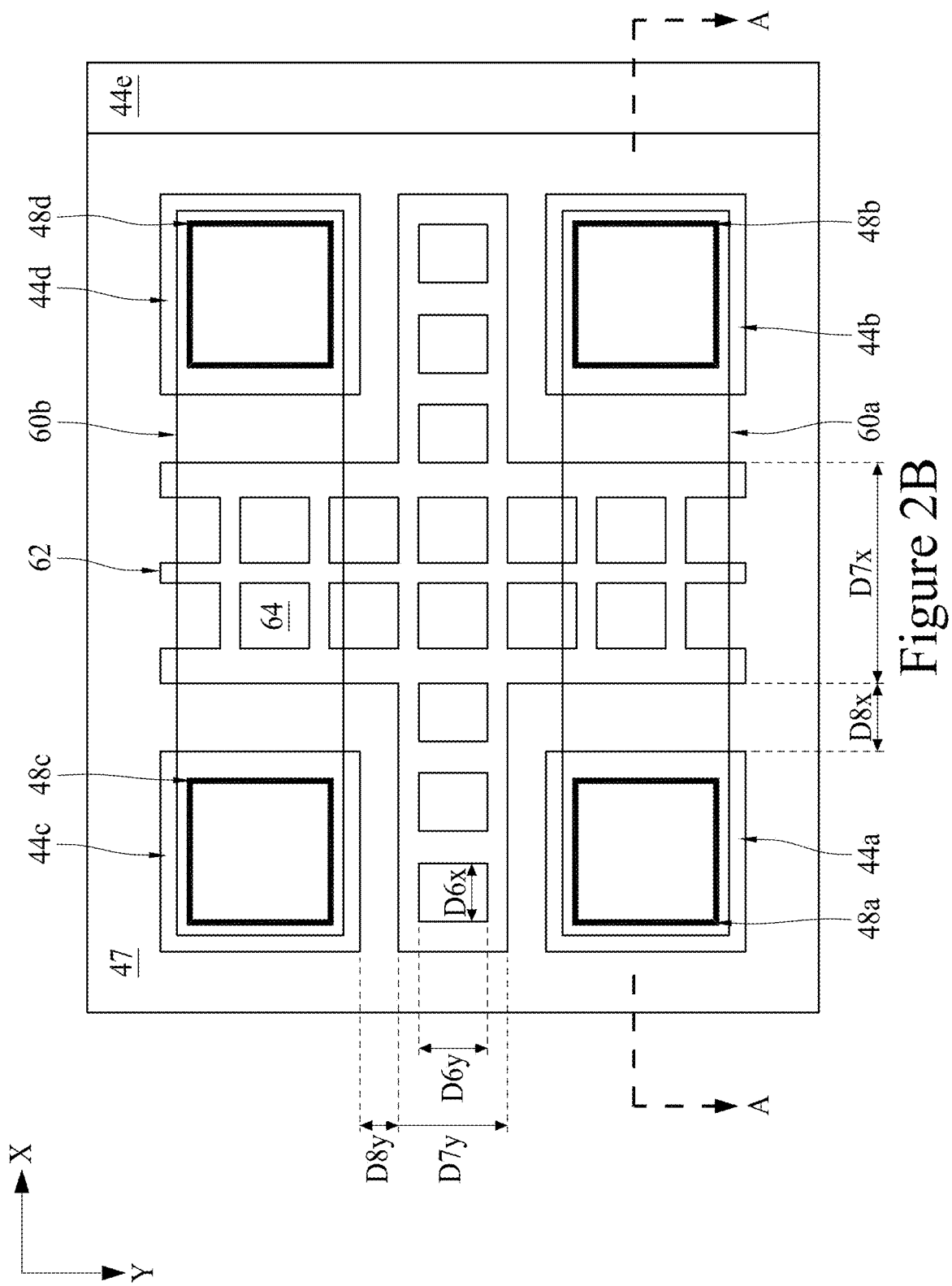

FIGS. 2A through 2C illustrate various views of a structure to attach a SMD/IPD in accordance with some embodiments. FIG. 2A is a cross-sectional view of a structure on which an SMD/IPD 54 is attached, and FIGS. 2B and 2C are overlaid layout views of respective portions of the structure. FIG. 2B illustrates an overlaid layout view of section B in FIG. 2A, and FIG. 2C illustrates an overlaid layout view of section C in FIG. 2A. Cross-section A-A in FIGS. 2B and 2C is the cross-sectional view illustrated in FIG. 2A. FIGS. 2A through 2C illustrate a modification of the example in FIGS. 1A through 1C, and discussion of like elements is omitted for brevity.

FIGS. 2A and 2B further illustrate that the upper metallization layer includes a dummy metallization pattern 62 over the lower dielectric layer 42. The dummy metallization pattern 62 is between the first upper metallization pattern 44a and the second upper metallization pattern 44b, between the first upper metallization pattern 44a and the third upper metallization pattern 44c, between the second upper metallization pattern 44b and the fourth upper metallization pattern 44d, and between the third upper metallization pattern 44c and the fourth upper metallization pattern 44d. As shown in the layout view of FIG. 2B, the dummy metallization pattern 62 forms a cross in which each of the first upper metallization pattern 44a, second upper metallization pattern 44b, third upper metallization pattern 44c, and fourth upper metallization pattern 44d is disposed in a separate quadrant. The dummy metallization pattern 62 can be electrically isolated from any other operational metallization pattern in the upper metallization layer.

As shown in FIG. 2A, the first under metallization 60a (and similarly the second under metallization 60b, although not specifically illustrated) can be planar laterally between the first extending portion 48a and the second extending portion 48b. This may result from a degree of planarity of the immediately underlying surface of the upper dielectric layer 47. The presence of the dummy metallization pattern 62 may allow this surface of the upper dielectric layer 47 to be planar between the first extending portion 48a and the second extending portion 48b depending on methods of forming the various components.

FIGS. 2A and 2B further illustrate that the dummy metallization pattern 62 can have openings 64 through the dummy metallization pattern 62. The openings 64 can take any configuration in the dummy metallization pattern 62. As illustrated, two columns of openings 64 extend along a y-direction, and one row of openings 64 extends along an x-direction.

Each of the openings has a sixth x-direction dimension D6x and a sixth y-direction dimension D6y, which may be equal. A first branch of the dummy metallization pattern 62 extending in a y-direction (with the two columns of openings 64) has a seventh x-direction dimension D7x, and another second branch of the dummy metallization pattern 62 extending in an x-direction (with the one row of openings 64) has a seventh y-direction dimension D7y. The first branch of the dummy metallization pattern 62 is an eighth x-direction dimension D8x from a neighboring upper metallization pattern 44. The second branch of the dummy metallization pattern 62 is an eighth y-direction dimension D8y from a neighboring upper metallization pattern 44.

In some embodiments, the dimensions D6x and D6y can be in a range from about 10 μm to about 50 μm, such as about 30 μm. In some embodiments, the dimension D7x can be in a range from about 30 μm to about 1130 μm, such as about 440 μm, and the dimension D7y can be in a range from about 30 μm to about 220 μm, such as about 50 μm. In some embodiments, the dimension D8x can be greater than about 40 μm, such as in a range from about 40 μm to about 100 μm, such as about 40 μm, and the dimension D8y can be greater than about 40 μm, such as in a range from about 40 μm to about 100 μm, such as about 40 μm.

Figure 3A:
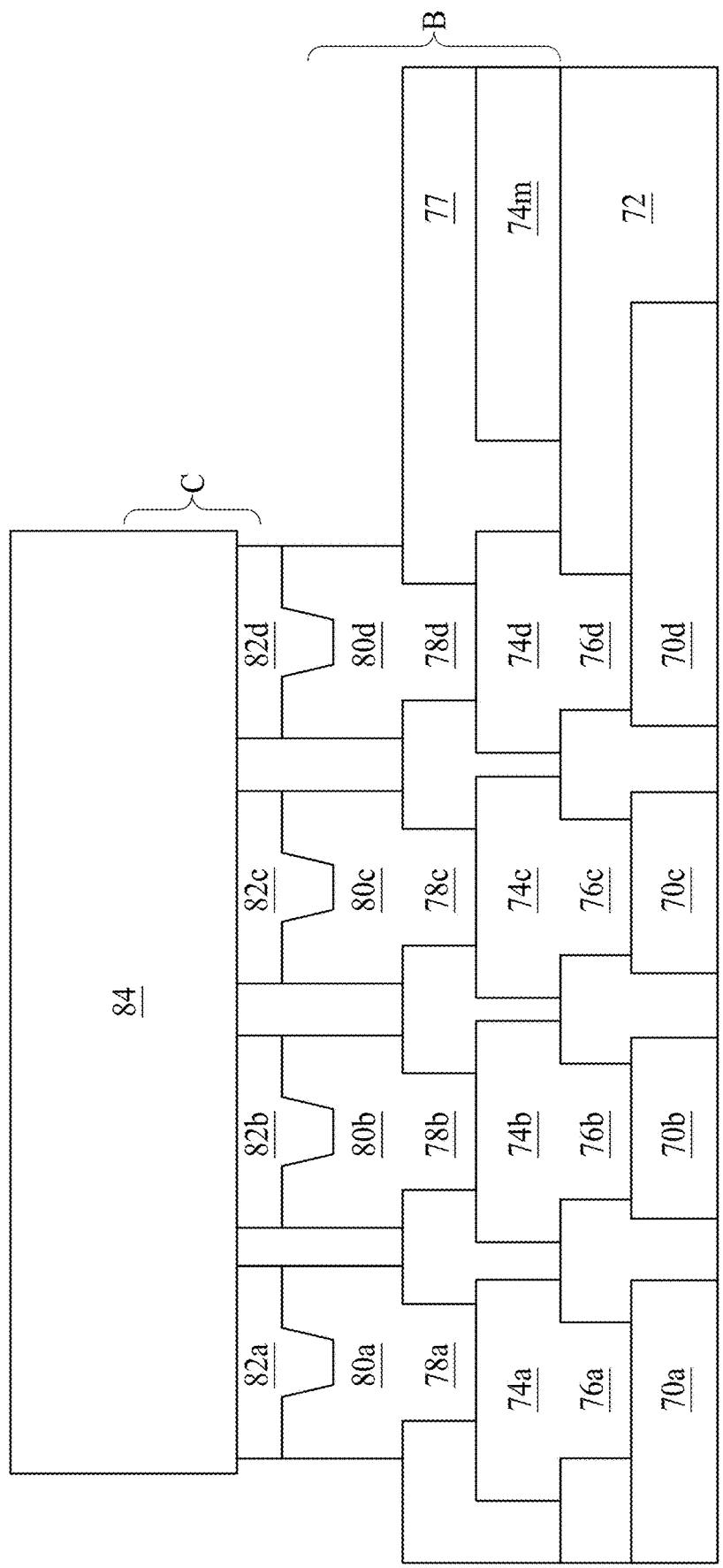
FIGS. 3A through 3C are various views of a third structure to attach a multi-terminal SMD/IPD in accordance with some embodiments.
Figure 3B:
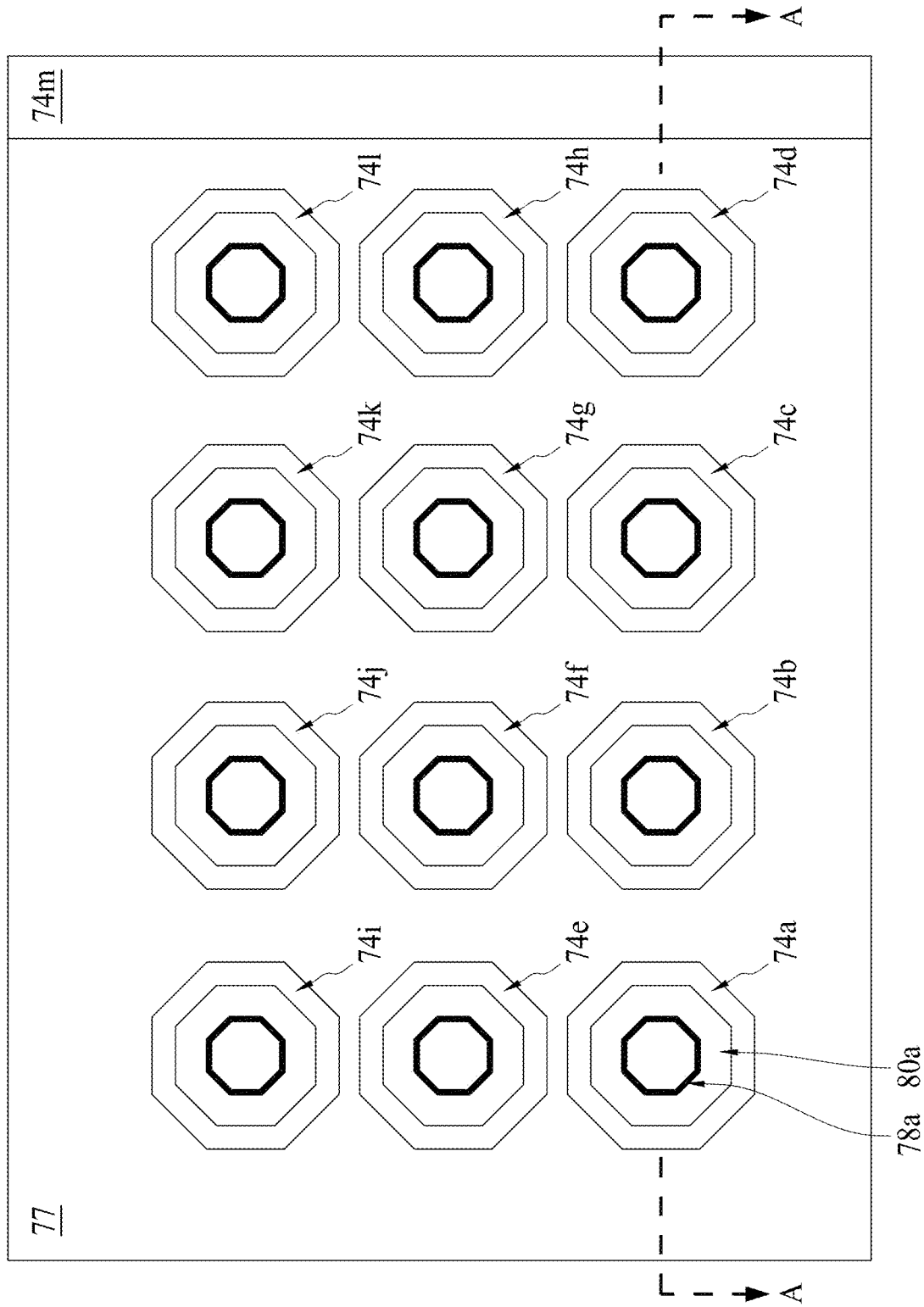
Figure 3C:

FIGS. 3A through 3C illustrate various views of a structure to attach a multi-terminal SMD/IPD in accordance with some embodiments. FIG. 3A is a cross-sectional view of a structure on which an SMD/IPD 84 is attached, and FIGS. 3B and 3C are overlaid layout views of respective portions of the structure. FIG. 3B illustrates an overlaid layout view of section B in FIG. 3A, and FIG. 3C illustrates an overlaid layout view of section C in FIG. 3A. Cross-section A-A in FIGS. 3B and 3C is the cross-sectional view illustrated in FIG. 3A. Example materials and methods for forming this structure are discussed in the context of the manufacturing process of FIGS. 4 through 13, and hence, such materials and processes are omitted here for brevity.

FIG. 3A illustrates a lower metallization layer including a first lower metallization pattern 70a, a second lower metallization pattern 70b, a third lower metallization pattern 70c, and a fourth lower metallization pattern 70d. A lower dielectric layer 72 is over and on the lower metallization layer, including the lower metallization patterns 70a, 70b, 70c, and 70d.

An upper metallization layer is on the lower dielectric layer 72, and the upper metallization layer includes a first upper metallization pattern 74a with a first via 76a, a second upper metallization pattern 74b with a second via 76b, a third upper metallization pattern 74c with a third via 76c, and a fourth upper metallization pattern 74d with a fourth via 76d. As illustrated in FIG. 3B (but not specifically in FIG. 3A), the upper metallization layer further includes fifth through twelfth upper metallization patterns 74e through 74l. In both FIGS. 3A and 3B, the upper metallization pattern further includes a thirteenth upper metallization pattern 74m. The first through fourth vias 76a through 76d extend through the lower dielectric layer 72 and each is electrically and directly mechanically coupled to a respective one of the first through fourth lower metallization patterns 70a through 70d and a respective one of the first through fourth upper metallization patterns 74a through 74d. An upper dielectric layer 77 is over and on the upper metallization layer, including the first through twelfth upper metallization patterns 74a through 74l.

A first through twelfth under metallizations 80a through 80l are on the upper dielectric layer 77. The first through twelfth under metallizations 80a through 80l include a respective one of first through twelfth extending portions 78a through 78l. The first through twelfth extending portions 78a through 78l extend through the upper dielectric layer 47 and each is electrically and directly mechanically coupled to a respective one of the first through twelfth upper metallization patterns 74a through 74l. The first through twelfth extending portions 78a through 78l extend through separate openings through the upper dielectric layer 77 to the respective one of the first through twelfth upper metallization pattern 74a through 74l. Although not specifically illustrated in a cross-sectional view, the fifth through eighth under metallizations 80e through 80h with the respective fifth through eighth extending portions 78e through 78h to the respective fifth through eighth upper metallization patterns 74e through 74h have a same or similar cross-section as corresponding components illustrated in FIG. 3A, and the ninth through twelfth under metallizations 80i through 80l with the respective ninth through twelfth extending portions 78i through 78l to the respective ninth through twelfth upper metallization patterns 74i through 74l have a same or similar cross-section as corresponding components illustrated in FIG. 3A. First through twelfth connectors 82a through 82l electrically and directly mechanically connect the first through twelfth under metallizations 80a through 80l and first through twelfth terminals of a SMD/IPD 84, respectively.

As shown in FIGS. 3B and 3C, the multi-terminal SMD/IPD 84 has three or more terminals. The terminals of the SMD/IPD 84 can be in an array, such as a 4×3 array as illustrated. Each stack of a respective connector 82, under metallization 80 with extending portion 78, and upper metallization pattern 74 can correspond to a respective one of the terminals of the SMD/IPD 84, and therefore, those stacks can also be arranged in an array, such as shown. Further, the under metallization 80, the extending portion 78, and the upper metallization pattern 74 are shown as having a hexagonal shape, and in other embodiments, these components can be any shape, such as square, rectangular, circular, ovaloid, hexagonal, or any other polygon. As shown, the under metallization 80 extends laterally beyond boundaries of the respective extending portion 78, and the upper metallization pattern 74 extends laterally beyond boundaries of the respective under metallization 80.

FIGS. 4 through 13 illustrate an example manufacturing process in which any of the foregoing structures illustrated in FIGS. 1A through 1C, 2A through 2C, and 3A through 3C may be used. The structure of FIGS. 2A through 2C is illustrated in this example process for convenience, but any other of the foregoing structures can be formed, as one of ordinary skill in the art will readily understand. Further, such structures can be formed on and/or in any substrate, package component, or package, and FIGS. 4 through 13 are provided as an example.

FIGS. 4 through 13 illustrate cross sectional views of intermediate steps during a manufacturing process for forming a package in accordance with some embodiments. FIG. 4 illustrates a carrier 200 and a release layer 202 formed on the carrier 200. The carrier 200 may be a glass carrier, a ceramic carrier, or the like. The carrier 200 may be a wafer. The release layer 202 may be formed of a polymer-based material, which may be removed along with the carrier 200 from the overlying structures that will be formed in subsequent steps. In some embodiments, the release layer 202 is an epoxy-based thermal-release material, which loses its adhesive property when heated. In other embodiments, the release layer 202 may be an ultra-violet (UV) glue, which loses its adhesive property when exposed to UV lights. The release layer 202 may be dispensed as a liquid and cured, may be a laminate film laminated onto the carrier 200, or may be the like. The top surface of the release layer 202 may be leveled and may have a high degree of planarity.

Figure 5:
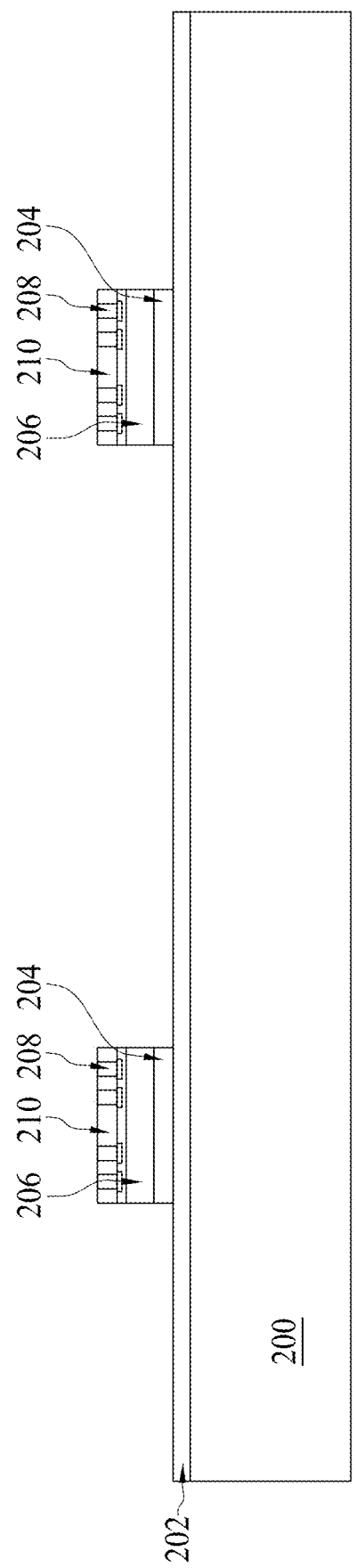

In FIG. 5, integrated circuit dies 206 are adhered to the release layer 202 by an adhesive 204. Before being adhered to the release layer 202, the integrated circuit dies 206 may be processed according to applicable manufacturing processes to form integrated circuits in the integrated circuit dies 206. For example, devices, such as transistors, diodes, capacitors, resistors, etc., may be formed in and/or on a semiconductor substrate, such as a semiconductor wafer, and may be interconnected by interconnect structures formed by, for example, metallization patterns in one or more dielectric layers on the semiconductor substrate to form an integrated circuit. Die connectors 208, such as conductive pillars (for example, comprising a metal such as copper), may be formed exterior to the integrated circuit dies 206 by, for example, plating to be mechanically and electrically coupled to the respective integrated circuit dies 206 on what may be referred to as respective active sides of the integrated circuit dies 206. A dielectric material 210 may be formed over the integrated circuit dies 206 and the die connectors 208, for example, by spin coating, lamination, Chemical Vapor Deposition (CVD), or the like. The adhesive 204 may be applied to a back side of the integrated circuit dies 206, such as to a back side of the respective semiconductor wafer. The adhesive 204 may be any suitable adhesive, epoxy, or the like. The integrated circuit dies 206 may be singulated, such as by sawing or dicing, and adhered to the release layer 202 by the adhesive 204 using, for example, a pick-and-place tool.

Figure 6:
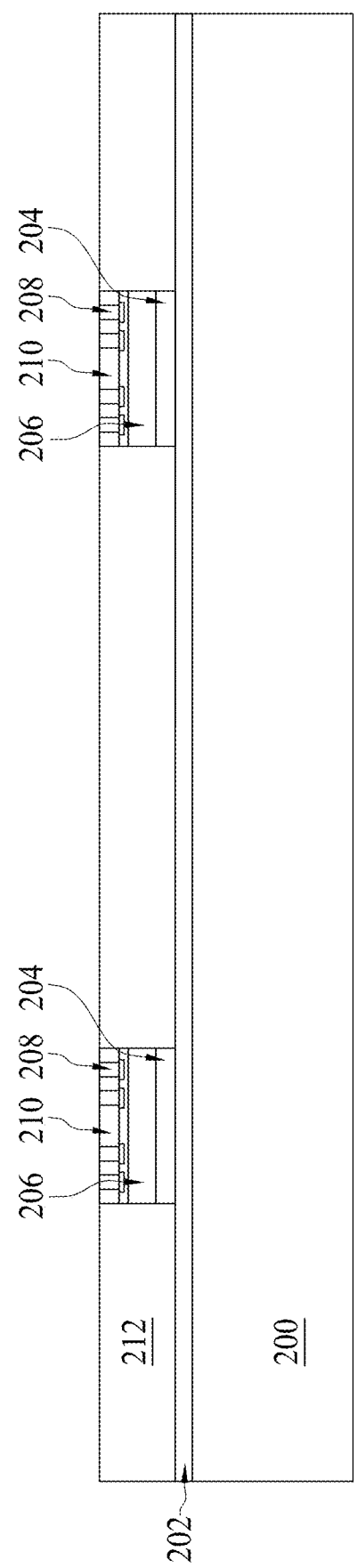

In FIG. 6, an encapsulant 212 is formed encapsulating the integrated circuit dies 206 on the release layer 202. The encapsulant 212 may be a molding compound, epoxy, or the like, and may be applied by compression molding, transfer molding, or the like. After curing, the encapsulant 212 may undergo a grinding process to expose die connectors 208. Top surfaces of the die connectors 208 and encapsulant 212 are co-planar after the grinding process. In some embodiments, the grinding process can be omitted if, for example, the die connectors 208 are exposed after encapsulating the integrated circuit dies 206.

Figure 7:
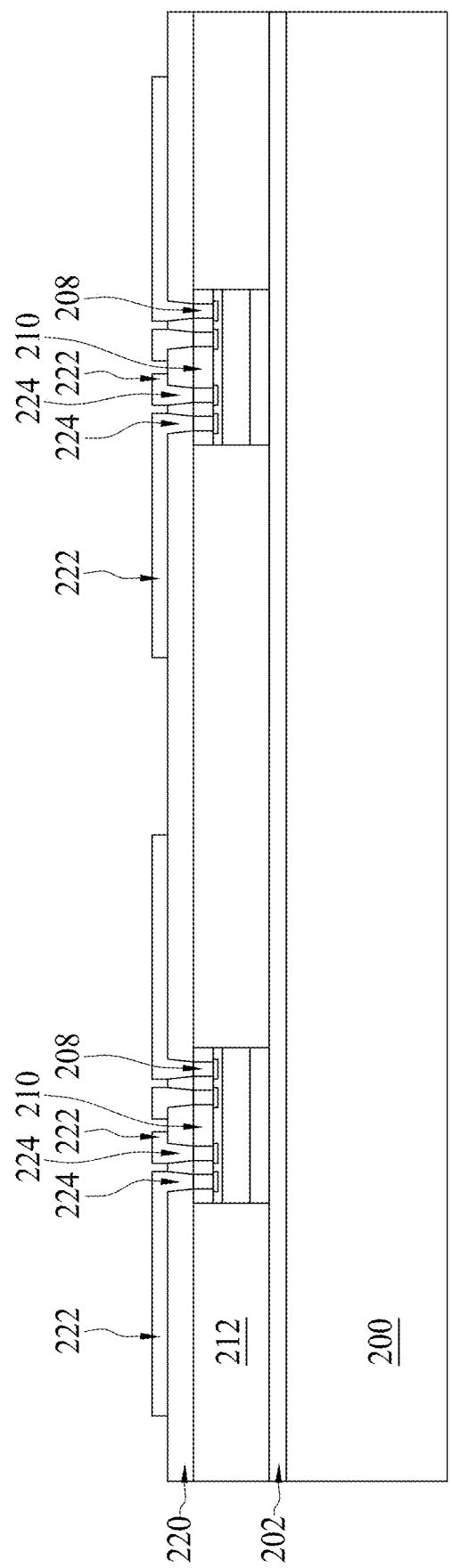

In FIG. 7, a dielectric layer 220 is formed on the encapsulant 212 and the die connectors 208. In some embodiments, the dielectric layer 220 is formed of a polymer, which may be a photo-sensitive material such as polybenzoxazole (PBO), polyimide, benzocyclobutene (BCB), or the like, that may be easily patterned using a lithography mask. In other embodiments, the dielectric layer 220 is formed of a nitride such as silicon nitride; an oxide such as silicon oxide, PhosphoSilicate Glass (PSG), BoroSilicate Glass (BSG), Boron-doped PhosphoSilicate Glass (BPSG), or the like. The dielectric layer 220 may be formed by spin coating, lamination, CVD, the like, or a combination thereof. The dielectric layer 220 is then patterned to form openings to expose the die connectors 208. The patterning may be by an acceptable process, such as by exposing the dielectric layer 220 to light when the dielectric layer is a photo-sensitive material, or by etching using, for example, an anisotropic etch.

Then, a metallization layer 222 with vias 224 through openings through the dielectric layer 220 is formed. A seed layer is formed over the dielectric layer 220 and in openings in the dielectric layer 220. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, Physical Vapor Deposition (PVD) or the like. A photo resist is formed and patterned on the seed layer. The photo resist may be formed by spin coating or the like and may be exposed to light for patterning. The pattern of the photo resist corresponds to a pattern of the metallization layer. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a conductive material, such as a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization layer 222 with vias 224 through the openings through the dielectric layer 220. Hence, the metallization layer 222 is electrically coupled to integrated circuits on the integrated circuit dies 206.

Figure 8:
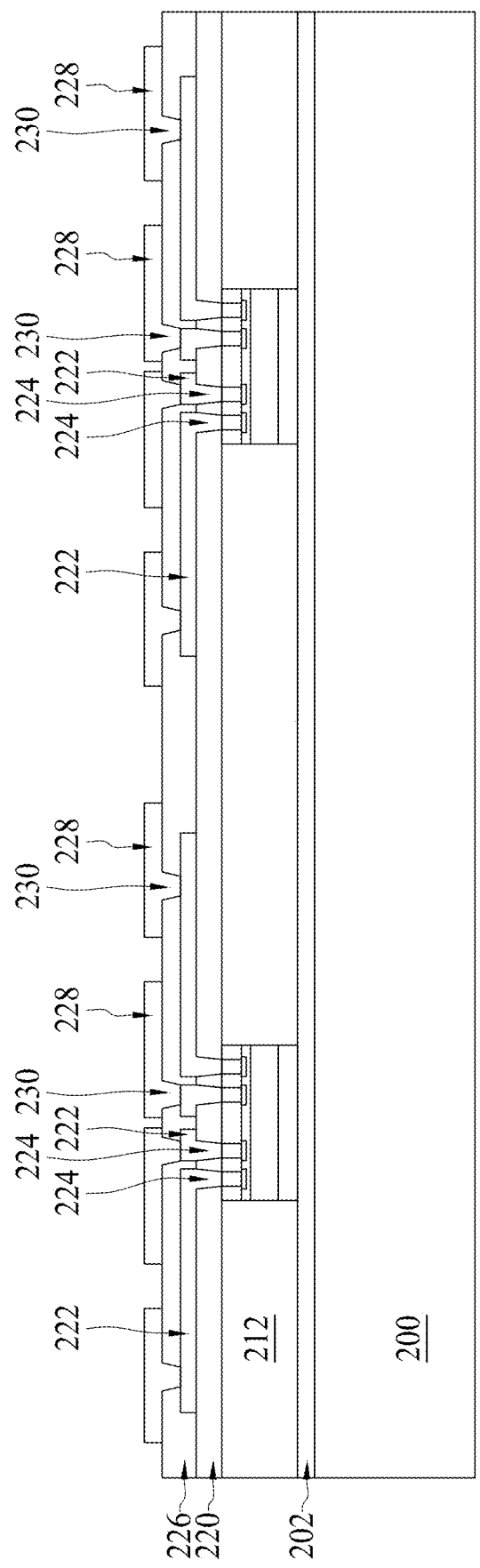

In FIG. 8, a dielectric layer 226 is formed on the metallization layer 222 and the dielectric layer 220 by repeating processes discussed above with respect to FIG. 7. Openings are formed through the dielectric layer 226 to expose portions of the metallization layer 222. Then, a metallization layer 228 with vias 230 through openings through the dielectric layer 226 is formed by processes discussed above with respect to FIG. 7. Hence, the metallization layer 228 is electrically coupled to the metallization layer 222.

Figure 9:
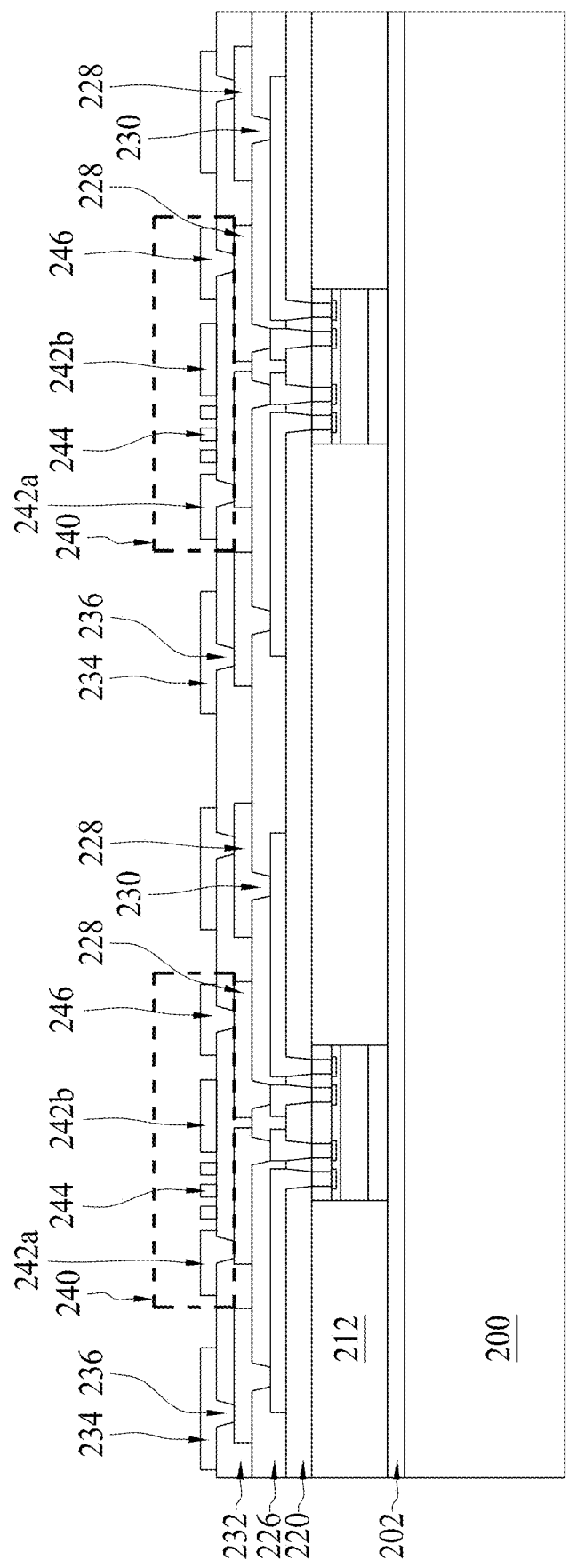

In FIG. 9, a dielectric layer 232 is formed on the metallization layer 228 and the dielectric layer 226 by repeating processes discussed above with respect to FIG. 7. Openings are formed through the dielectric layer 232 to expose portions of the metallization layer 228. Then, a metallization layer 234 with vias 236 through openings through the dielectric layer 232 is formed by processes discussed above with respect to FIG. 7. Hence, the metallization layer 234 is electrically coupled to the metallization layer 228.

Region 240 identifies components that can correspond to components in FIGS. 1A through 1C, 2A through 2C, and 3A through 3C. Metallization layer 234 can correspond to the upper metallization layer in any of FIGS. 1A through 1C, 2A through 2C, and 3A through 3C. For example, metallization layer 234 includes a first metallization pattern 242a and a first metallization pattern 242b that correspond to first upper metallization pattern 44a and second upper metallization pattern 44b, respectively, in FIG. 2A. Further, the metallization layer 234 includes a dummy metallization pattern 244 that corresponds to dummy metallization pattern 62 in FIG. 2A, and the metallization layer 234 includes a third metallization pattern 246 that corresponds to fifth upper metallization pattern 44e in FIG. 2A.

In some embodiments, some dielectric layers and metallization layers can be omitted, while in other embodiments, more dielectric layers and metallization layers may be included.

Figure 10:
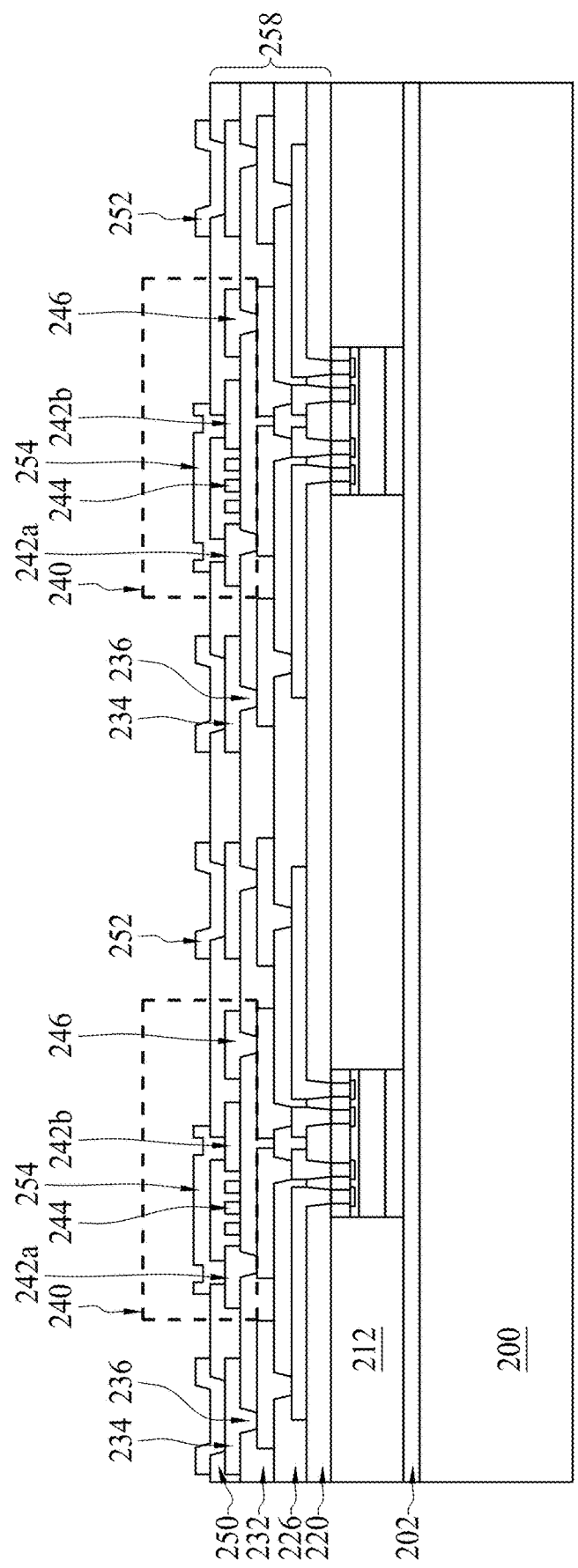

In FIG. 10, a dielectric layer 250 is formed on the metallization layer 234 and the dielectric layer 232 by repeating processes discussed above with respect to FIG. 7.

A redistribution structure 258 is thus formed, which includes the dielectric layers 220, 226, 232, and 250 and the metallization layer 222, 228, and 234 with vias 224, 230, and 236, respectively. Openings are formed through the dielectric layer 250 to expose portions of the metallization layer 234. Then, a under metallizations 252 and 254 are formed on the dielectric layer 250 and through openings through the dielectric layer 250 by processes discussed above with respect to FIG. 7 for forming a metallization layer. Hence, the under metallizations 252 and 254 are electrically coupled to the metallization layer 234. Under metallization 254 corresponds to first under metallization 60a in FIG. 2A.

Figure 11:
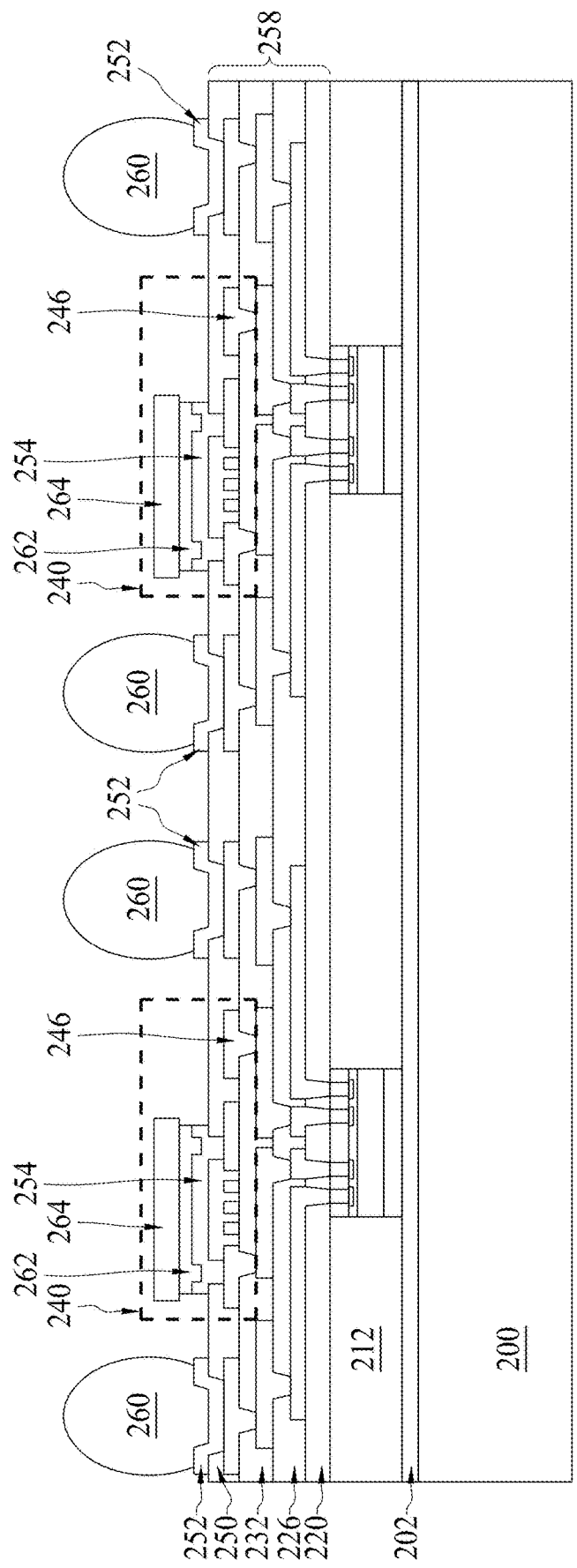

In FIG. 11, connectors 262 are formed on the under metallizations 254. In some embodiments, the connectors 262 are a solder-containing material (such as a lead-free solder-containing material), and can further include a flux material. The connectors 262 can be formed on the under metallizations 254 by using a printing process or the like. SMD/IPDs 264 are then placed on the connectors 262, such as by using a pick-and-place tool. The connectors 262 are attached to respective terminals of the SMD/IPDs 264. A flux in the connectors 262 can adhere the SMD/IPDs 264 to the under metallizations 254 until a reflow process is performed to reflow solder in the connectors 262 to more permanently attach the SMD/IPDs 264 to the under metallizations 254.

Further, external connectors 260 are formed on the under metallizations 252. The external connectors 260 can be, for example, solder, such as a Sn—Ag alloy, a Sn—Ag—Cu alloy, or the like, which may further be lead-free or lead-containing, formed by a ball drop process, printing, plating, or the like.

Figure 12:
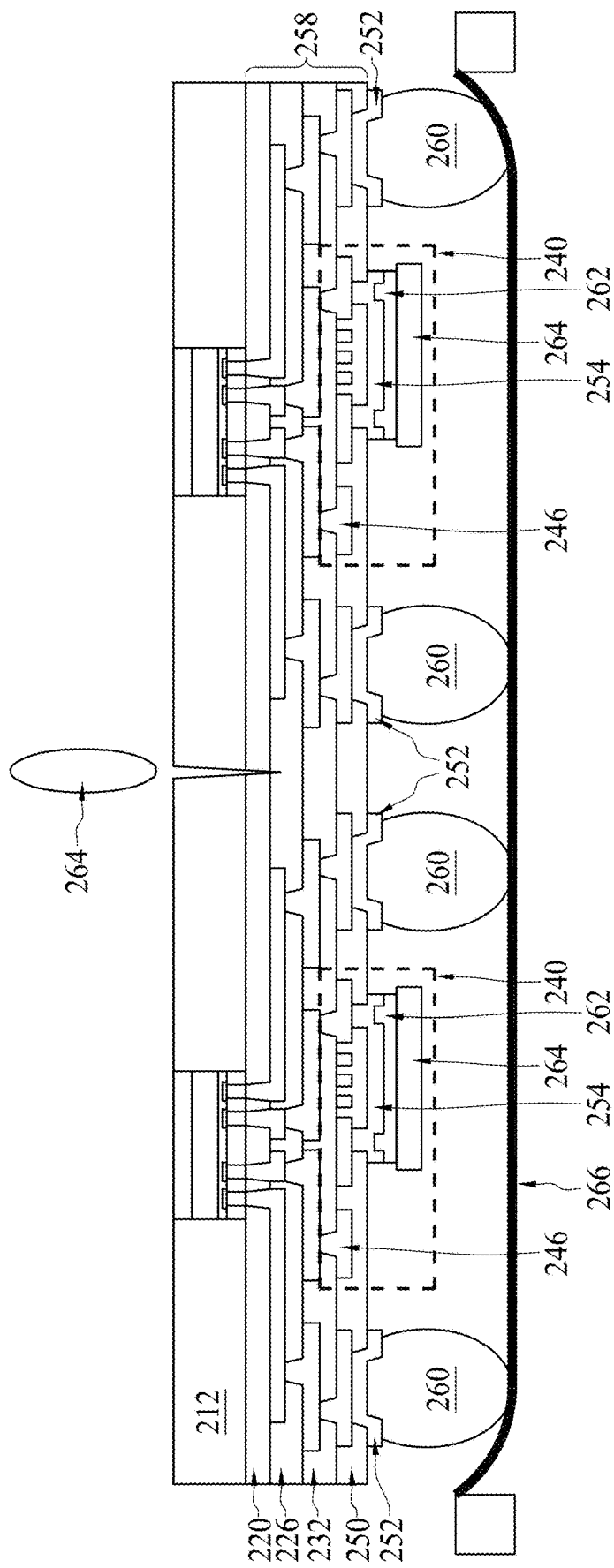

In FIG. 12, a carrier de-bonding is performed to detach (de-bond) carrier 200 from the overlying structure. In accordance with some embodiments, the de-bonding includes projecting a light such as a laser light or an UV light on release layer 202 so that release layer 202 decomposes under the heat of the light and carrier 200 can be removed. The structure is then flipped over and placed on a dicing tape 266. Then, a package singulation process, such as by dicing or sawing, is performed to singulate individual packages.

Figure 13:
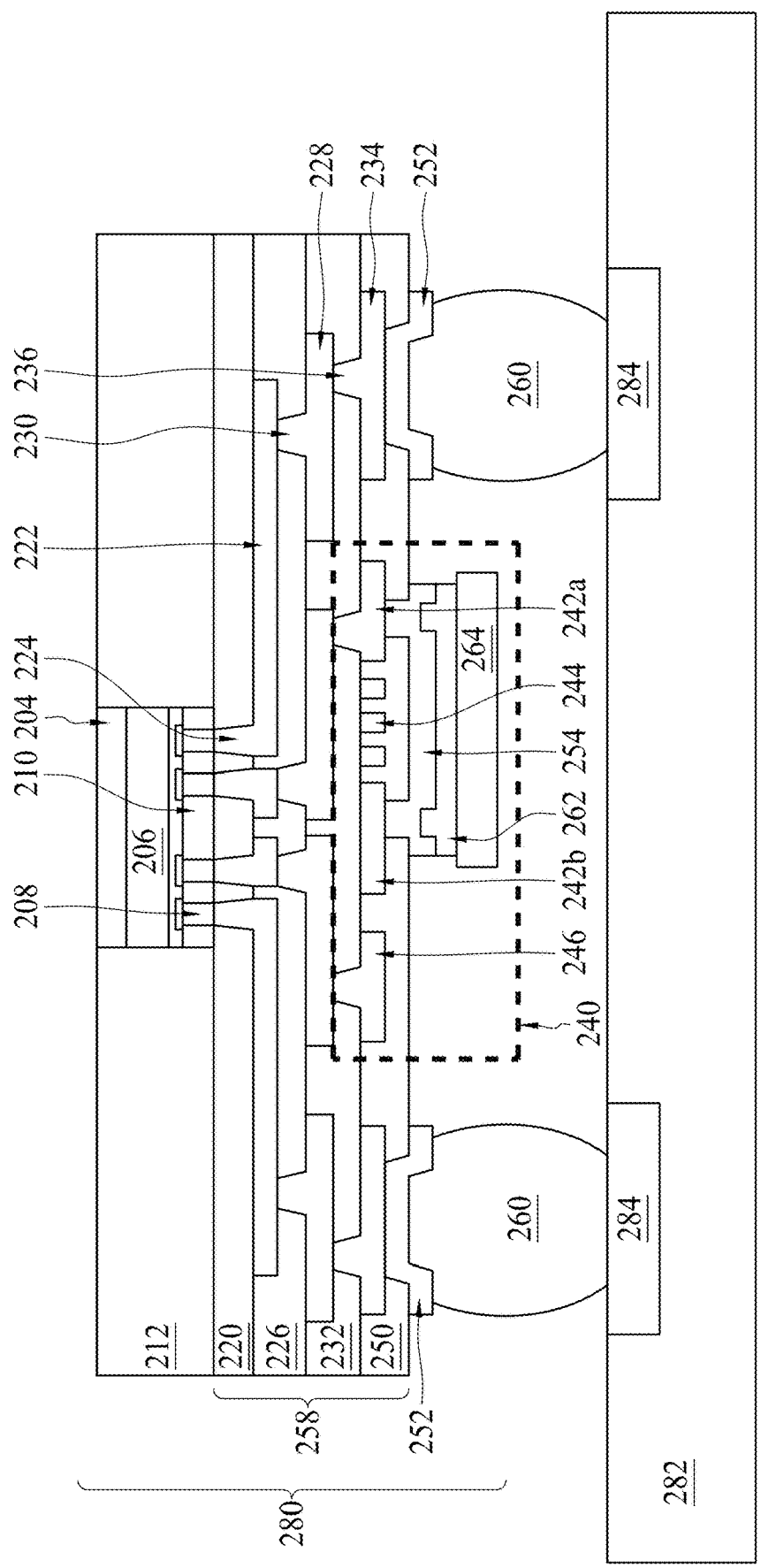

FIG. 13 illustrates a package 280 as singulated in FIG. 12 and attached to a substrate 282. The substrate 282 can be a package substrate, such as a Printed Circuit Board (PCB) or the like. The substrate 282 has bond pads 284 to which external connectors 260 are contacted and reflowed to form an electrical and mechanical connection.

Embodiments can achieve advantages. For example, embodiments according to structures discussed above can reduce a stress at an upper metallization pattern and/or upper dielectric layer. By reducing a stress, risk of delamination and/or cracking in the upper dielectric layer and/or upper metallization pattern may be mitigated. Yield of a manufactured structure can thus be increased.

An embodiment is a package structure. The package structure includes an integrated circuit die embedded in an encapsulant and a redistribution structure on the encapsulant and electrically coupled to the integrated circuit die. The redistribution structure includes a metallization layer distal from the encapsulant and the integrated circuit die, and a dielectric layer distal from the encapsulant and the integrated circuit die and on the metallization layer. The package structure also includes a first under metallization structure on the dielectric layer and a Surface Mount Device and/or Integrated Passive Device ("SMD/IPD") attached to the first under metallization structure. The first under metallization structure includes a first extending portion extending through a first opening of the dielectric layer to a first pattern of the metallization layer, a second extending portion extending through a second opening of the dielectric layer to a second pattern of the metallization layer, a third extending portion extending through a third opening of the dielectric layer to a third pattern of the metallization layer, and a fourth extending portion extending through a fourth opening of the dielectric layer to a fourth pattern of the metallization layer. The first opening, the second opening, the third opening, and the fourth opening are physically separated from each other.

Another embodiment is a package structure. The package structure comprises a die comprising an integrated circuit, an encapsulant at least laterally encapsulating the die, a redistribution structure on and adjoining the encapsulant, a first under-terminal structure, a second under-terminal structure, and a Surface Mount Device and/or Integrated Passive Device ("SMD/IPD"). The redistribution structure comprises a dielectric layer on a metallization layer. The first under-terminal structure comprises a first extending portion extending through a first opening through the dielectric layer to the metallization layer and comprises a second extending portion extending through a second opening through the dielectric layer to the metallization layer. The second under-terminal structure comprises a third extending portion extending through a third opening through the dielectric layer to the metallization layer and comprises a fourth extending portion extending through a fourth opening through the dielectric layer to the metallization layer. The first opening, the second opening, the third opening, and the fourth opening are distinct. The SMD/IPD has a first terminal attached to the first under-terminal structure and a second terminal attached to the second under-terminal structure.

A further embodiment is a method. The method comprises encapsulating an integrated circuit die in an encapsulant; forming a redistribution structure on the encapsulant, the redistribution structure comprising a dielectric layer on a first metallization pattern, a second metallization pattern, a third metallization pattern, and a fourth metallization pattern, wherein the first metallization pattern, the second metallization pattern, the third metallization pattern, and the fourth metallization pattern are physically separated; forming a first under-terminal metallization and a second under-terminal metallization on the redistribution structure, the first under-terminal metallization comprising a first extending portion extending through a first opening of the dielectric layer to the first metallization pattern and comprising a second extending portion extending through a second opening of the dielectric layer to the second metallization pattern, the second under-terminal metallization comprising a third extending portion extending through a third opening of the dielectric layer to the third metallization pattern and comprising a fourth extending portion extending through a fourth opening of the dielectric layer to the fourth metallization pattern; and attaching a Surface Mount Device and/or Integrated Passive Device ("SMD/IPD") to the first under-terminal metallization and the second under-terminal metallization, a first terminal of the SMD/IPD being attached to the first under-terminal metallization, and a second terminal of the SMD/IPD being attached to the second under-terminal metallization.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
an integrated circuit die;
a redistribution structure on the integrated circuit die and electrically coupled to the integrated circuit die, the redistribution structure comprising:
an uppermost metallization layer distal from the integrated circuit die; and
an uppermost dielectric layer on the uppermost metallization layer;
a first under-terminal metallization on the uppermost dielectric layer, the first under-terminal metallization including a first extending portion, a second extending portion, and an first upper portion connecting the first extending portion and the second extending portion, wherein the first extending portion extends through the uppermost dielectric layer and is connected to a first pattern of the uppermost metallization layer, wherein the second extending portion extends through the uppermost dielectric layer and is connected to a second pattern of the uppermost metallization layer, wherein the first upper portion extends continuously from the first extending portion to the second extending portion along a first surface of the uppermost dielectric layer facing away from the integrated circuit die; and
an electrical device, wherein a first connector of the electrical device is attached to the first under-terminal metallization, wherein the first connector is formed of a first conductive material, wherein the first conductive material extends continuously from the first extending portion to the second extending portion.

2. The package structure of claim 1, wherein the first connector physically contacts the first extending portion and the second extending portion of the first under-terminal metallization.

3. The package structure of claim 1, further comprising:
an under metallization structure on the uppermost dielectric layer, the under metallization structure extending through the uppermost dielectric layer and connected to the uppermost metallization layer; and
an external connector on the under metallization structure.

4. The package structure of claim 3, further comprising a package substrate bonded to the external connector.

5. The package structure of claim 3, wherein the external connector extends further from the integrated circuit die than the electrical device.

6. The package structure of claim 1, wherein the first upper portion of the first under-terminal metallization has a first recess aligned with the first extending portion and has a second recess aligned with the second extending portion.

7. The package structure of claim 6, wherein the first connector of the electrical device has a first protrusion and a second protrusion, wherein the first protrusion extends into the first recess, and the second protrusion extends into the second recess.

8. The package structure of claim 1, wherein the uppermost metallization layer comprises dummy metal patterns that are electrically isolated.

9. The package structure of claim 8, wherein at least portions of the dummy metal patterns are disposed between the first pattern and the second pattern of the uppermost metallization layer.

10. The package structure of claim 8, wherein the dummy metal patterns have openings, and wherein the uppermost dielectric layer extends into the openings.

11. The package structure of claim 10, wherein the dummy metal patterns comprise an electrically conductive material that extends continuously and surrounds the openings of the dummy metal patterns.

12. A package structure comprising:
a die;
an encapsulant around the die;
a redistribution structure on the encapsulant, the redistribution structure comprising a dielectric layer on a metallization layer;
a first under-terminal structure on the redistribution structure, the first under-terminal structure comprising:
a first extending portion extending through the dielectric layer to a first pattern of the metallization layer;
a second extending portion extending through the dielectric layer to a second pattern of the metallization layer; and
a first upper portion on the dielectric layer and connecting the first extending portion and the second extending portion; and
a dummy pattern in the metallization layer and under the first upper portion of the first under-terminal structure, wherein the dummy pattern comprises an electrically conductive material and is electrically isolated.

13. The package structure of claim 12, wherein the first under-terminal structure extends laterally beyond lateral extents of the dummy pattern.

14. The package structure of claim 12, further comprising an electrical device having a first terminal attached to the first under-terminal structure.

15. The package structure of claim 14, wherein the first terminal comprises an electrically conductive material that extends continuously from the first extending portion of the first under-terminal structure to the second extending portion of the first under-terminal structure.

16. A method comprising:
surrounding an integrated circuit die with an encapsulant;
forming a redistribution structure on the encapsulant, the redistribution structure comprising a topmost dielectric layer on a topmost metallization layer, wherein the topmost metallization layer has a first metallization pattern and a second metallization pattern physically separated from the first metallization pattern;
forming a first under-terminal metallization on the redistribution structure, the first under-terminal metallization comprising a first extending portion extending through the topmost dielectric layer to the first metallization pattern and comprising a second extending portion extending through the topmost dielectric layer to the second metallization pattern; and
attaching a first terminal of an electrical device to the first under-terminal metallization, wherein the first terminal extends continuously from the first extending portion of the first under-terminal metallization to the second extending portion of the first under-terminal metallization.

17. The method of claim 16, wherein the first under-terminal metallization extends continuously along an upper surface of the topmost dielectric layer from the first extending portion to the second extending portion.

18. The method of claim 16, further comprising forming dummy metallization patterns in the topmost metallization layer, wherein at least portions of the dummy metallization patterns are formed between the first metallization pattern and the second metallization pattern, wherein the dummy metallization patterns are electrically isolated.

19. The method of claim 18, wherein forming the dummy metallization patterns comprises forming openings through the dummy metallization patterns.

20. The method of claim 16, wherein forming the first under-terminal metallization comprises forming an upper portion of the first under-terminal metallization over the topmost dielectric layer, the upper portion extending continuously along an upper surface of the topmost dielectric layer from the first extending portion to the second extending portion, and wherein the upper portion of the first under-terminal metallization are formed to have a first recess aligned with the first extending portion and to have a second recess aligned with the second extending portion.

* * * * *